(12) United States Patent
Sitaram

(10) Patent No.: US 6,833,302 B2
(45) Date of Patent: Dec. 21, 2004

(54) METHOD FOR FABRICATING A MEMORY CELL

(75) Inventor: Arkalgud Sitaram, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 106 days.

(21) Appl. No.: 10/377,350

(22) Filed: Feb. 28, 2003

(65) Prior Publication Data

US 2003/0162352 A1 Aug. 28, 2003

(30) Foreign Application Priority Data

Feb. 28, 2002 (DE) .......................................... 102 08 774

(51) Int. Cl.[7] ...................... H01L 21/8242; H01L 21/20
(52) U.S. Cl. ...................... 438/243; 438/243; 438/386
(58) Field of Search ............................... 438/243, 386, 438/388, 476, 660

(56) References Cited

U.S. PATENT DOCUMENTS

| | | | | |
|---|---|---|---|---|
| 5,360,758 A | * | 11/1994 | Bronner et al. | 438/243 |
| 5,395,786 A | * | 3/1995 | Hsu et al. | 438/248 |
| 5,563,433 A | * | 10/1996 | Nagata et al. | 257/301 |
| 5,614,431 A | * | 3/1997 | DeBrosse | 438/243 |
| 5,670,805 A | * | 9/1997 | Hammerl et al. | 257/301 |
| 6,008,104 A | * | 12/1999 | Schrems | 438/386 |
| 6,037,210 A | * | 3/2000 | Leas | 438/245 |
| 6,140,175 A | * | 10/2000 | Kleinhenz et al. | 438/243 |
| 6,329,703 B1 | * | 12/2001 | Schrems et al. | 257/636 |
| 6,344,390 B1 | | 2/2002 | Bostelmann et al. | |

FOREIGN PATENT DOCUMENTS

| | | |
|---|---|---|
| DE | 119 11 149 C1 | 5/2000 |
| DE | 100 45 694 A1 | 4/2002 |
| EP | 0 491 976 B1 | 7/1992 |
| EP | 0 939 430 A2 | 9/1999 |
| EP | 0 939 435 A1 | 9/1999 |
| EP | 0 971 414 A1 | 1/2000 |

\* cited by examiner

*Primary Examiner*—Matthew Smith
*Assistant Examiner*—Chuong Anh Luu
(74) *Attorney, Agent, or Firm*—Laurence A. Greenberg; Werner H. Stemer; Gregory L. Mayback

(57) ABSTRACT

A method for fabricating a memory cell, in particular, a DRAM memory cell, having a transistor and a trench capacitor that are connected to one another through a buried strap contact includes applying at least one diffusion barrier on an upper surface of a first filling material of the trench capacitor to prevent an undesirable outdiffusion of dopant from the first filling material. Thus, with the diffusion barrier intact, at most a dopant that is possibly present in a second filling material can outdiffuse into adjoining regions. However, the outdiffusion of dopant from the first filling material can be initiated in a targeted manner by breaking open the diffusion barrier by a thermal treatment. Through the possibility of restraining the diffusion of the dopant until a suitable point in the process, it is possible to avoid an excessive outdiffusion into a contact region with a transistor.

19 Claims, 2 Drawing Sheets

METHOD FOR FABRICATING A MEMORY CELL

BACKGROUND OF THE INVENTION

Field of the Invention

The present invention relates to a method for fabricating a memory cell having a transistor and a trench capacitor that are connected to one another through a buried strap contact. The present invention relates, in particular, to a method for fabricating a DRAM memory cell having a transistor and a trench capacitor that are connected to one another through a buried strap contact.

Memory cells having trench capacitors are used in integrated circuits (ICs), such as, for example, random access memories (RAMs), dynamic RAMs (DRAMs), synchronous DRAMs (SDRAMs), static RAMs (SRAMs), and read-only memories (ROMs). The ICs use capacitors typically for the purpose of storing charge. Thus, in dynamic random access memories (DRAMs) by way of example, the charge state of the capacitor is used to represent a data bit.

Furthermore, a DRAM memory cell also includes a so-called selection transistor, which is electrically conductively connected to the capacitor. The selection transistor is typically a MOS transistor, i.e., it has a source region and a drain region that are separated from one another by a channel region. Disposed above the channel region is a gate electrode through which the current flow in the channel can be controlled. To drive the memory cell, one of the source/drain regions (S/D regions) is connected to the bit line and the gate electrode is connected to the word line of the memory. The other S/D region is connected to the capacitor.

The ongoing endeavor to minimize the memory devices fosters the design of DRAMs with a larger density and smaller characteristic size, i.e., smaller memory cell area. This could be made possible by using smaller components, that is to say, smaller capacitors too. However, reducing the size of the capacitors also lowers the storage capacitance thereof, which adversely affects the function of the memory cell: on one hand, it is no longer possible to guarantee the required reliability when reading out the stored value; and, on the other hand, the refresh frequency has to be increased in the case of DRAMs.

A solution to this problem is afforded by a trench capacitor in which the capacitor area is disposed vertically in a trench in the substrate. This configuration allows a relatively large capacitor area, i.e., a sufficiently large capacitance, in conjunction with a small surface requirement. To fabricate a trench capacitor, first, a trench is etched into a substrate. To form a first capacitor electrode, a dopant, for example, is, then, introduced into the substrate material surrounding the trench wall. The trench wall is, then, lined with a dielectric, it being possible to use ONO, for example, as the dielectric. Subsequently, the trench is filled with an electrically conductive filling material. This filling material forms the second capacitor electrode. An insulator collar is, preferably, formed in an upper region of the trench insulator, which collar prevents a leakage current toward the first electrode. Methods for fabricating trench capacitors are described, for example, in European Patent Application EP 0 491 976 B1, corresponding to U.S. Pat. No. 5,390,618 to Wild, and EP 0 971 414 A1, corresponding to U.S. Pat. No. 6,509,599 to Wurster et al.

To fabricate a memory cell, the capacitor must, finally, be connected to an S/D region of the transistor, which can be done through a strap contact, for example. The strap contact is typically formed as a buried strap contact, i.e., the contact is fabricated below the upper substrate surface, because the configuration has the advantage that it takes up less area than a strap contact located at the surface. Consequently, a buried strap contact facilitates a minimization of the memory cell.

During the fabrication of such a buried strap contact, a bridge is produced on the filling material of the second electrode in the trench, which bridge typically includes polysilicon and constitutes a part of the strap contact. A doped diffusion region is formed in that region of the monocrystalline silicon that adjoins the bridge, which diffusion region extends as far as an S/D region of the transistor. The diffusion region and the bridge together form the strap contact that produces an electrically conductive connection between the second capacitor electrode and the S/D region of the transistor. Methods for fabricating such buried strap contacts are described for example in European Patent Application EP 0 939 430 A2, corresponding to U.S. Pat. No. 6,068,928 to Schrems et al., EP 0 939 435 A1, corresponding to U.S. Pat. No. 6,329,703 to Schrems et al., and EP 0 971 414 A1.

As mentioned above, highly doped polysilicon is typically used for the electrically conductive filling material. An example of a suitable dopant is As, which is introduced into the polysilicon in a concentration of from $10^{19}$ to $10^{20}$ cm$^{-3}$. As indicated by arrows in FIG. 3, this dopant diffuses from the filling material 3 into the polysilicon of the bridge 6 and the diffusion region 12, i.e., the adjoining monocrystalline silicon of the substrate 1, and, thus, produces the conductivity required for the electrical contact in the region between the capacitor and the transistor. In this case, the dopant concentration is a critical quantity: on one hand, an excessively weak doping increases the resistance of the diffusion region, which adversely affects the performance of the memory cell; and, on the other hand, an excessively high doping leads to excessive outdiffusion into the diffusion region and to a possible short circuiting of the two S/D regions of the transistor.

If the intention is to miniaturize the transistor to reduce the space requirement of the memory cells, then the channel region of the transistor is inevitably miniaturized as well. To prevent a short circuiting of the S/D regions in such a case, it would be necessary, therefore, either to reduce the dopant concentration in the filling material of the second capacitor electrode or, else, to restrict the permissible temperature range of subsequent process steps to an extent such that the outdiffusion of dopant from the filling material is sufficiently restricted.

However, as described above, reducing the dopant concentration entails the risk of an excessively high contact resistance of the capacitor. However, limiting the permissible temperature range for subsequent process steps considerably restricts the freedom in the process configuration, which is, likewise, undesirable.

SUMMARY OF THE INVENTION

It is accordingly an object of the invention to provide a method for fabricating a memory cell that overcomes the hereinafore-mentioned disadvantages of the heretofore-known devices and methods of this general type and that improves a method for fabricating a memory cell and reduces or completely avoids the difficulties mentioned herein.

In particular, the present invention specifies a fabrication method that decouples the permissible range of process temperatures from the dopant concentration in the electrode material. Furthermore, the present invention specifies an improved fabrication method that can easily be incorporated into an existing manufacturing process. Moreover, the present invention specifies an improved fabrication method that permits a miniaturization of a memory cell transistor without adversely affecting the performance of the memory cell.

With the foregoing and other objects in view, there is provided, in accordance with the invention, a method for fabricating a memory cell, in particular, a DRAM memory cell, which has a transistor and a trench capacitor that are connected to one another through a buried strap contact. In such a case, the method according to the invention has the following steps:

a) a trench capacitor filled with a first doped filling material is produced;

b) at least one diffusion barrier above an upper surface of the first filling material is produced;

c) a second filling material is applied above the at least one diffusion barrier to form a bridge as part of the buried strap contact;

d) a transistor having a gate electrode and source/drain regions is produced;

e) an RTP step for breaking open the at least one diffusion barrier is carried out; and f) at least one thermal treatment is carried out to produce a diffusion region as part of the buried strap contact.

The application of at least one diffusion barrier on an upper surface of the first filling material prevents an undesirable outdiffusion of dopant from the first filling material. Thus, with the diffusion barrier intact, at most a dopant that is possibly present in the second filling material can outdiffuse into adjoining regions. However, the outdiffusion of dopant from the first filling material can be initiated in a targeted manner by breaking open the diffusion barrier by a thermal treatment. Through the possibility of restraining the diffusion of the dopant until a suitable point in the process, it is possible to avoid an excessive outdiffusion into a contact region with a transistor. A short circuiting of the S/D regions of the transistor is, thus, prevented without having to reduce the dopant concentration in the electrode material of the capacitor.

Moreover, a decoupling of the diffusion process from the permissible temperature range of subsequent thermal process steps is achieved insofar as, with the diffusion barrier still intact, it is possible to set process temperatures that, without the diffusion barrier, would have led to a high degree of diffusion of the dopant with the disadvantageous consequences described above.

Steps a) to f) of the method according to the invention need not necessarily be performed in the order specified. If the second filling material is doped highly enough, then, by way of example, step f can also be performed as early as before step e) and at least a substantial part of the diffusion region can be produced.

In the context of the present invention, RTP stands for rapid thermal processing, i.e., rapid, brief heating of the workpiece to a high temperature. Such an RTP step can be integrated into an existing process sequence at almost any point without difficulty.

In accordance with another mode of the invention, the RTP step includes heating to a temperature of between approximately 1,000° C. and approximately 1,100° C. In such a case, the time duration is, preferably, between 5 s and 60 s, in particular, the time duration is between 5 s and 30 s.

In accordance with a further mode of the invention, the diffusion barrier is formed by a thin oxide layer, preferably, silicon oxide.

By forming the diffusion barrier as an oxide layer, in particular, as a silicon oxide layer, method step b) can be integrated into an already existing process by a simple oxidation step. In such a case, silicon oxide represents a material for the diffusion barrier that can be formed above the upper surface of the first filling material without a relatively high outlay in most fabrication processes.

In accordance with an added mode of the invention, the oxide layer is thin enough to be broken open in a subsequent RTP step. In accordance with an additional mode of the invention, the thickness of the oxide layer is less than 10 nm.

The destructability of the diffusion barrier by an RTP step is ensured, in particular, by the diffusion barrier being thin enough to be broken open by the RTP step. The corresponding setting of the layer thickness opens up a simple possibility of controlling the process conditions under which the diffusion barrier is broken open. In particular, thin oxide layers having a thickness of less than 10 nm can easily be broken open by RTP steps, in which case small oxide balls, for example, can form at the interface.

In accordance with yet another mode of the invention, the RTP step for breaking open the diffusion barrier is disposed in the overall fabrication process of an integrated circuit such that the permissible temperature range of thermal processes effected after the RTP step suffices for bringing about an adequate diffusion of dopant from the first filling material into a contact region with a transistor.

As described above, undesirable outdiffusion of dopant from the electrode material cannot take place while the diffusion barrier exists. In particular, with the diffusion barrier intact, it is, thus, possible to set process temperatures that would otherwise lead to an excessively high degree of outdiffusion and the corresponding adverse consequences. It is advantageous, therefore, to place the RTP step, which eliminates the diffusion barrier and allows the outdiffusion of dopant to commence, in the overall process such that, through the temperature range of subsequent process steps, although a sufficient diffusion of dopant into the contact region between capacitor and transistor takes place, at the same time an excessive diffusion, which would lead to a short circuiting of source and drain, is avoided. In particular, it is advantageous, therefore, to perform the RTP step only when the process steps that are still to be performed no longer require temperatures that are all that high.

In accordance with yet a further mode of the invention, polysilicon is used as the first filling material because such a material is known to have good properties, for instance, when filling the trench.

In accordance with yet an added mode of the invention, the first filling material is highly doped in order, thus, on one hand, to provide a sufficient dopant reservoir for the subsequent outdiffusion and, on the other hand, to ensure a sufficiently low resistance of the capacitor electrode.

In accordance with yet an additional mode of the invention, As or P is used as the dopant for the first filling material.

These materials are customary in the fabrication of $n^+$-doped polysilicon regions. However, it is also possible to use a $p^+$-doped second electrode, in which case B, for example, is used as the dopant. The dopant concentration is typically about from $10^{19}$ to $10^{20}$ cm$^{-3}$ for charge carriers both of the p type and of the n type.

In accordance with again another mode of the invention, polysilicon is used as the second filling material.

In accordance with again a further mode of the invention, the second filling material has a lower dopant concentration than the first filling material. In particular, in accordance with a concomitant mode of the invention, the second filling material is undoped.

By virtue of the fact that the second filling material has a lower dopant concentration than the first filling material, in particular, if it is undoped, it is possible to open up further leeway for subsequent thermal process steps: because the rate of diffusion of the dopant increases at higher temperature, a suitably chosen lower dopant concentration of the second filling material makes it possible to ensure that the desired concentration of dopants in the contact region is established by the thermal processes following the RTP step.

If, after the diffusion barrier has been opened, high-temperature processes that bring about a high degree of outdiffusion are provided, for example, then, an excessively high degree of diffusion into the transistor region can, nevertheless, be prevented by only a low dopant concentration in the second filling material. In particular, it may be advantageous for the second filling material to be left entirely undoped.

Other features that are considered as characteristic for the invention are set forth in the appended claims.

Although the invention is illustrated and described herein as embodied in a method for fabricating a memory cell, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
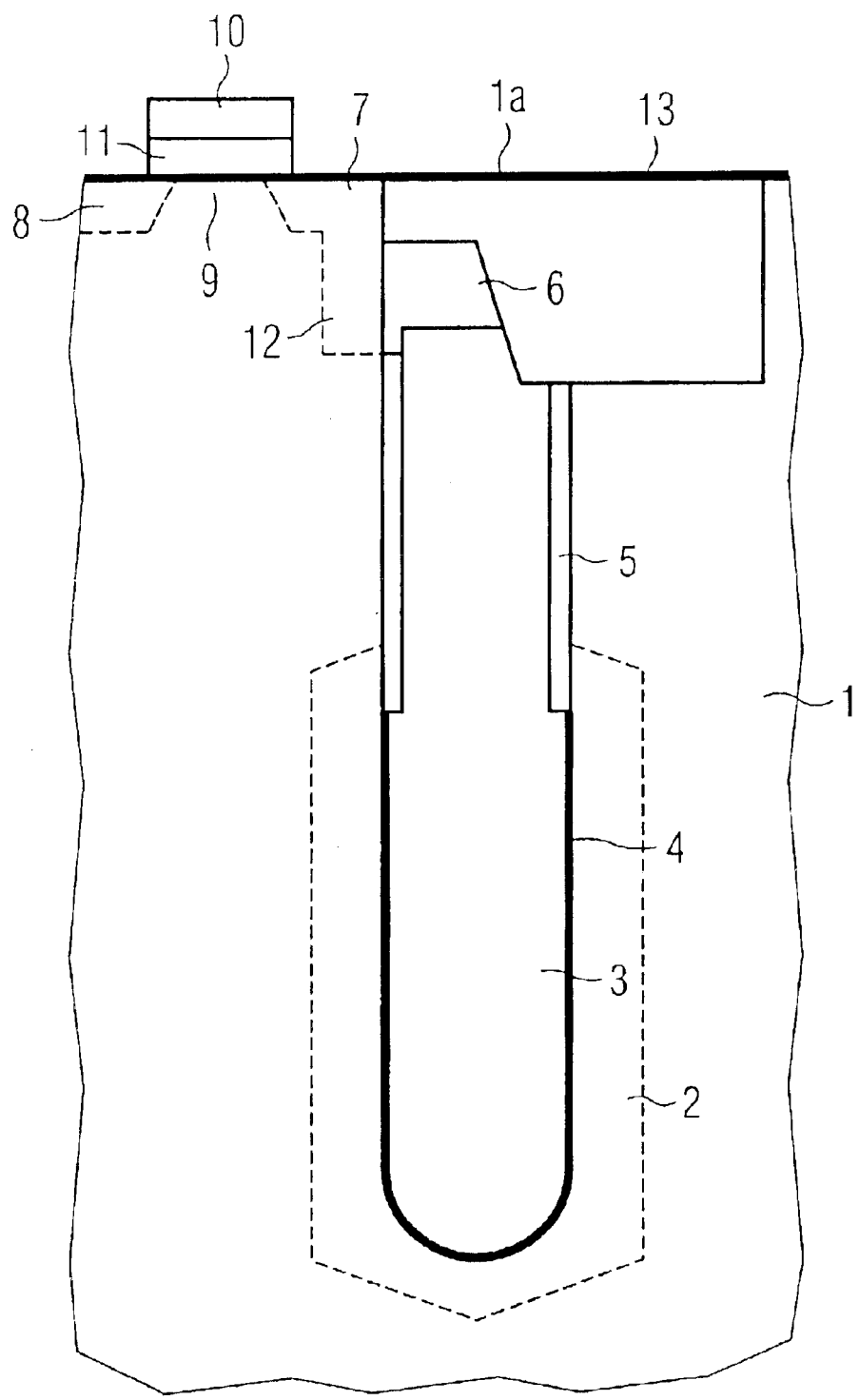
FIG. 1 is a fragmentary, cross-sectional view of a DRAM memory cell fabricated in accordance with an exemplary embodiment of the present invention.

Referring now to the figures of the drawings in detail and first, particularly to FIG. 1 thereof, there is shown the construction of a DRAM memory cell having a trench capacitor, as can be fabricated in accordance with an exemplary embodiment of the present invention.

A trench is formed in a substrate 1, a first electrode 2 being formed in a lower region of the trench in the adjoining substrate. A second electrode 3 made of a first filling material is formed within the trench, the second electrode 3 being isolated from the first electrode 2 by the capacitor dielectric 4. In this case, the first electrode 2 is produced by introducing dopant into a region of the substrate 1 that adjoins the trench wall. A dielectric, e.g., ONO, is, subsequently, deposited onto the trench wall, materials with a high dielectric constant being preferred here. Finally, the first filling material is deposited and the trench thereby filled. In such an exemplary embodiment, the first filling material is polysilicon doped with arsenic to a concentration of $10^{20}$ cm$^{-3}$.

An insulator collar 5 is formed in an upper region of the capacitor, which collar may be constructed, for example, from a thermal oxide layer and a TEOS layer applied thereto. The insulator collar 5 prevents or reduces at least the occurrence of leakage currents from a contact region of the capacitor to the first electrode 2. Furthermore, a trench isolation 13 (STI) having a depth of 0.25 μm, for example, is formed, which isolates the memory cell illustrated from adjacent cells. As shown, the trench isolation 13 overlaps a region of the trench and leaves a remaining region open so that a current flow through the remaining region is possible. Disposed above the second electrode 3 is a bridge 6, which directly adjoins a contact region 12 formed by diffusion. The bridge 6 and the diffusion region 12 together form a buried strap contact.

Above the diffusion region 12, a first S/D region 7 is formed in the substrate. The first S/D region 7 is spaced apart from a second S/D region 8 by a channel region 9. Disposed above the channel region 9 is a gate electrode 10 of the transistor, which is separated from the channel region by a dielectric 11.

The method for fabricating a memory cell in accordance with an exemplary embodiment of the present invention will now be explained with reference to FIGS. 2A and 2B. It is assumed in this case that the trench capacitor has already been produced to an extent such that the first and second electrodes 2, 3 and also the capacitor dielectric 4 are present. The insulator collar 5 shall already have been produced as well.

Figure 2A:
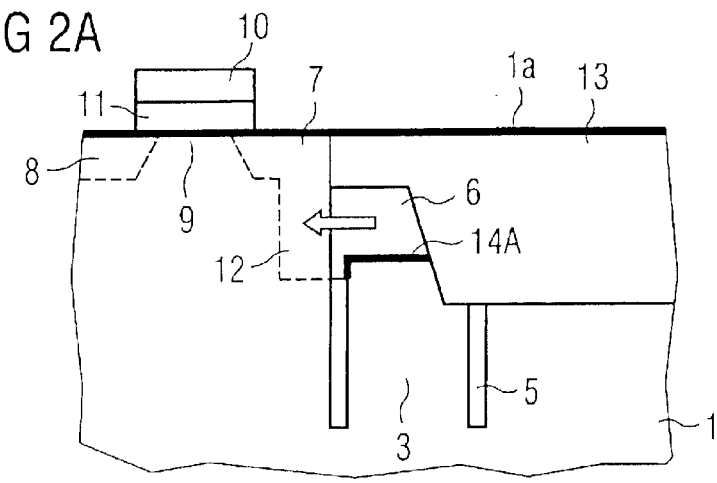
FIG. 2A is a fragmentary, cross-sectional view of a detail of the memory cell of FIG. 1 in a first stage of the fabrication method according to the invention.

As shown in FIG. 2A, a diffusion barrier 14A is produced above an upper surface of the second electrode 3, which is formed by a first filling material. In this exemplary embodiment, the diffusion barrier is formed from a layer of silicon oxide less than 1 nm thick, which is produced in a simple manner by an oxidation step. As long as the oxide layer 14A is intact, no dopant can diffuse out of the first filling material 3 into the region of the bridge 6 and of the diffusion region 12. Only dopant contained in the second filling material of the bridge 6 can migrate into the diffusion region 12, as is indicated by the arrow in FIG. 2A. Thus, the channel region 9 between the S/D regions 7, 8 of the transistor is protected from short circuiting. Thermal process steps that are performed after the production of the diffusion barrier 14A are, thus, harmless with regard to the intensified outdiffusion of dopant from the first filling material.

Figure 2B:
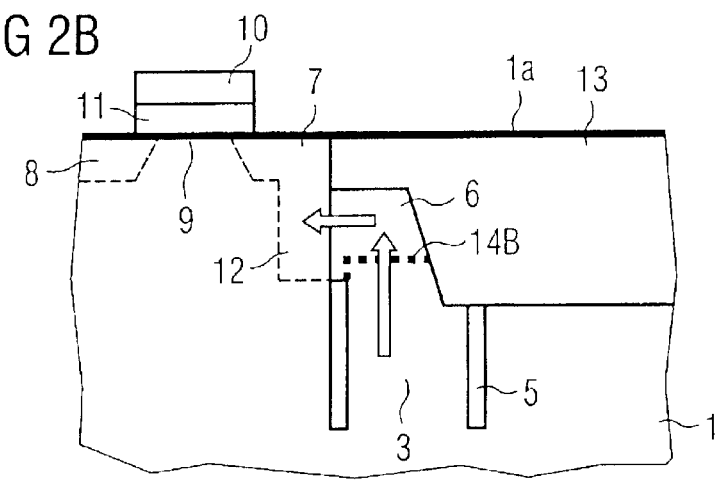
FIG. 2B is a fragmentary, cross-sectional view of the detail of FIG. 2A in a second stage of the fabrication method according to the invention.
Figure 3:
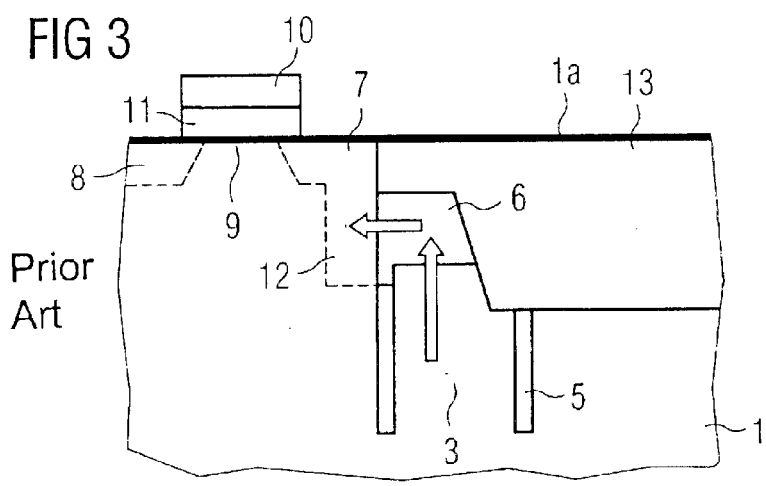
FIG. 3 is a fragmentary, cross-sectional view of the detail of FIG. 2A in the case of a prior art fabrication method.

FIG. 2B shows the configuration of FIG. 2A after an RTP step has taken place. In the present exemplary embodiment, a temperature of 1,050° C. is set for 20 s during the RTP step. The diffusion barrier 14B is, then, broken open on account of the RTP step. As indicated by the arrows, dopant can, now, also diffuse out of the first filling material 3 into the bridge 6 and the diffusion region 12. Because the RTP step can be introduced practically at any desired point in the manufacturing process, this opens up the possibility of controlling the commencement of the diffusion with regard to thermal processes that follow the RTP step. As a result, it is possible to avoid an excessive outdiffusion of dopant from the first filling material 3 and the associated disadvantages. Consequently, a miniaturization of the memory cell transistor, and, in particular, of the channel region 9, can also be carried out without lowering the dopant concentration in the first filling material.

I claim:

1. A method for fabricating a memory cell having a transistor and a trench capacitor connected to one another through a buried strap contact, which comprises:
   a) producing a trench capacitor filled with a first doped filling material, the first filling material having an upper surface;
   b) producing at least one diffusion barrier above the upper surface of the first filling material;
   c) applying a second filling material above the at least one diffusion barrier to form a bridge as part of the buried strap contact;
   d) producing a transistor having a gate electrode and source/drain regions;
   e) carrying out an RTP step for breaking open the at least one diffusion barrier; and
   f) carrying out a thermal treatment to produce a diffusion region as part of the buried strap contact.

2. The method according to claim 1, which further comprises carrying out the RTP step by heating to a temperature of between approximately 1,000° C. and approximately 1,100° C.

3. The method according to claim 2, which further comprises carrying out the RTP step for a time duration between 5 s and 60 s.

4. The method according to claim 3, which further comprises carrying out the RTP step for a time duration between 5 s and 30 s.

5. The method according to claim 1, which further comprises forming the diffusion barrier with a thin oxide layer.

6. The method according to claim 1, which further comprises forming the diffusion barrier with an oxide layer.

7. The method according to claim 1, which further comprises forming the diffusion barrier with silicon oxide.

8. The method according to claim 1, which further comprises forming the diffusion barrier with a thickness of less than 10 nm.

9. The method according to claim 1, which further comprises forming the diffusion barrier with a silicon oxide layer having a thickness of less than 10 nm.

10. The method according to claim 1, which further comprises utilizing polysilicon as the first filling material.

11. The method according to claim 1, which further comprises providing the first filling material is as a highly doped first filling material.

12. The method according to claim 11, which further comprises utilizing As or P as dopant for the first filling material.

13. The method according to claim 12, which further comprises doping the first filling material to a dopant concentration between approximately $10^{19}$ cm$^{-3}$ and approximately $10^{20}$ cm$^{-3}$.

14. The method according to claim 13, which further comprises:
   utilizing polysilicon as the second filling material; and
   doping the second filling material with a dopant concentration lower than the dopant concentration of the first filling material.

15. The method according to claim 11, which further comprises doping the first filling material to a dopant concentration between approximately $10^{19}$ cm$^{-3}$ and approximately $10^{20}$ cm$^{-3}$.

16. The method according to claim 1, which further comprises utilizing polysilicon as the second filling material.

17. The method according to claim 1, which further comprises doping the second filling material with a lower dopant concentration than a dopant concentration of the first filling material.

18. The method according to claim 1, which further comprises providing the second filling material as substantially undoped.

19. A method for fabricating a DRAM memory cell having a transistor and a trench capacitor connected to one another through a buried strap contact, which comprises:
   a) producing a trench capacitor filled with a first doped filling material, the first filling material having an upper surface;
   b) producing at least one diffusion barrier above the upper surface of the first filling material;
   c) applying a second filling material above the at least one diffusion barrier to form a bridge as part of the buried strap contact;
   d) producing a transistor having a gate electrode and source/drain regions;
   e) carrying out an RTP step for breaking open the at least one diffusion barrier; and
   f) carrying out a thermal treatment to produce a diffusion region as part of the buried strap contact.

* * * * *